United States Patent
Quevy et al.

(10) Patent No.: US 9,422,157 B2
(45) Date of Patent: Aug. 23, 2016

(54) METHOD FOR TEMPERATURE COMPENSATION IN MEMS RESONATORS WITH ISOLATED REGIONS OF DISTINCT MATERIAL

(71) Applicant: Semiconductor Manufacturing International (Shanghai) Corporation, Shanghai (CN)

(72) Inventors: Emmanuel P. Quevy, El Cerrito, CA (US); David H. Bernstein, Berkeley, CA (US)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 343 days.

(21) Appl. No.: 13/901,258

(22) Filed: May 23, 2013

(65) Prior Publication Data

US 2015/0266724 A1    Sep. 24, 2015

Related U.S. Application Data

(62) Division of application No. 12/638,919, filed on Dec. 15, 2009, now Pat. No. 8,464,418, which is a division of application No. 11/716,115, filed on Mar. 9, 2007, now Pat. No. 7,639,104.

(51) Int. Cl.
*B81C 1/00* (2006.01)
*H03H 3/007* (2006.01)
(Continued)

(52) U.S. Cl.
CPC ......... *B81C 1/0069* (2013.01); *B81C 1/00349* (2013.01); *B81C 1/00523* (2013.01);
(Continued)

(58) Field of Classification Search
CPC ............. H03H 3/0076; H03H 9/2457; H03H 9/2405; H03H 2009/02496; H03H 2009/2442; G02B 6/358; Y10T 29/42; Y10T 29/49005; Y10T 29/49165; B81C 1/0069; B81C 1/00523; B81C 1/00349
See application file for complete search history.

(56) References Cited

U.S. PATENT DOCUMENTS 5,027,189 A    6/1991    Shannon et al.
5,541,469 A    7/1996    Kaida
(Continued)

FOREIGN PATENT DOCUMENTS

JP        362035534 A        2/1987
JP         04077011 A    *   3/1992
WO    WO2007/072409 A2     6/2007

OTHER PUBLICATIONS

Howe et al., Office Action, Apr. 30, 2008, U.S. Appl. No. 11/801,774, 10 pgs.
(Continued)

*Primary Examiner* — A. Dexter Tugbang
(74) *Attorney, Agent, or Firm* — Kilpatrick Townsend & Stockton LLP

(57) ABSTRACT

Methods of forming MEMS resonators containing a first structural material and a second structural material to tailor the resonator's temperature coefficient of frequency (TCF). The first structural material has a different Young's modulus temperature coefficient than the second structural material. In one embodiment, the first structural material may be formed on substrate and patterned, and the second structural material may be formed over the first structural material and planarized to expose the first structural material. A resonator may be patterned that contains both the first and second structural materials.

21 Claims, 15 Drawing Sheets

(51) Int. Cl.
*H03H 9/24* (2006.01)
*G02B 6/35* (2006.01)
*H03H 9/02* (2006.01)

(52) U.S. Cl.
CPC ......... *H03H3/0076* (2013.01); *H03H 9/2405* (2013.01); *H03H 9/2457* (2013.01); *G02B 6/358* (2013.01); *H03H 2009/02496* (2013.01); *H03H 2009/2442* (2013.01); *Y10T 29/42* (2015.01); *Y10T 29/49005* (2015.01); *Y10T 29/49165* (2015.01)

(56) References Cited

U.S. PATENT DOCUMENTS

| | | | |
|---|---|---|---|
| 5,912,528 | A | 6/1999 | Kumada |
| 5,963,857 | A * | 10/1999 | Greywall ............ H03H 9/2457 |
| 6,557,419 | B1 | 5/2003 | Herb et al. |
| 6,686,807 | B1 | 2/2004 | Giousouf et al. |
| 6,708,491 | B1 | 3/2004 | Weaver et al. |
| 6,717,336 | B2 | 4/2004 | Kawashima |
| 6,739,190 | B2 | 5/2004 | Hsu et al. |
| 6,987,432 | B2 | 1/2006 | Lutz et al. |
| 6,996,884 | B2 | 2/2006 | Aratake et al. |
| 7,023,065 | B2 | 4/2006 | Ayazi et al. |
| 7,071,793 | B2 | 7/2006 | Lutz et al. |
| 7,202,761 | B2 | 4/2007 | Lutz et al. |
| 7,211,926 | B2 | 5/2007 | Quevy et al. |
| 7,300,814 | B2 | 11/2007 | Cunningham et al. |
| 7,350,424 | B2 | 4/2008 | Hjelt et al. |
| 7,495,199 | B2 | 2/2009 | Jankowiak |
| 7,514,853 | B1 | 4/2009 | Howe et al. |
| 7,591,201 | B1 | 9/2009 | Bernstein et al. |
| 7,639,104 | B1 | 12/2009 | Quevy et al. |
| 7,889,030 | B2 | 2/2011 | Schoen et al. |
| 8,234,774 | B2 | 8/2012 | Hagelin et al. |
| 2002/0119638 | A1 | 8/2002 | Wilson et al. |
| 2002/0154380 | A1 | 10/2002 | Gelbart |
| 2003/0006679 | A1 | 1/2003 | Kawashima |
| 2004/0065940 | A1 | 4/2004 | Ayazi et al. |
| 2004/0147055 | A1 | 7/2004 | Brosnihan et al. |
| 2004/0184709 | A1 * | 9/2004 | Kubby et al. .......... G02B 6/358 |
| 2004/0207492 | A1 | 10/2004 | Nguyen et al. |
| 2005/0046504 | A1 | 3/2005 | Xiaoyu et al. |
| 2005/0052092 | A1 | 3/2005 | Laermer |
| 2005/0250236 | A1 | 11/2005 | Takeuchi et al. |
| 2006/0017523 | A1 | 1/2006 | Bhave et al. |
| 2006/0032306 | A1 | 2/2006 | Robert |
| 2006/0033594 | A1 | 2/2006 | Lutz et al. |
| 2006/0186971 | A1 | 8/2006 | Lutz et al. |
| 2007/0277620 | A1 | 12/2007 | Melamud et al. |
| 2007/0296526 | A1 | 12/2007 | Lutz et al. |
| 2008/0105951 | A1 | 5/2008 | Sato et al. |
| 2008/0224241 | A1 | 9/2008 | Inaba et al. |
| 2009/0158566 | A1 | 6/2009 | Hagelin et al. |
| 2009/0160581 | A1 | 6/2009 | Hagelin et al. |
| 2010/0019869 | A1 | 1/2010 | Durand et al. |
| 2010/0032789 | A1 | 2/2010 | Schoen et al. |
| 2010/0093125 | A1 | 4/2010 | Quevy et al. |
| 2011/0084781 | A1 | 4/2011 | Quevy et al. |

OTHER PUBLICATIONS

Howe et al., Amendment, Jul. 30, 2008, U.S. Appl. No. 11/801,774, 16 pgs.
Howe et al., Notice of Allowance, Nov. 26, 2008, U.S. Appl. No. 11/801,774, 8 pgs.
Bernstein et al., Office Action, Feb. 27, 2009, U.S. Appl. No. 11/716,285, 14 pgs.
Bernstein et al., Amendment, May 27, 2009, U.S. Appl. No. 11/716,285, 17 pgs.
Bernstein et al., Notice of Allowance, Jun. 22, 2009, U.S. Appl. No. 11/716,285, 4 pgs.
Quevy et al., Office Action, Oct. 6, 2008, U.S. Appl. No. 11/716,115, 10 pgs.
Quevy et al., Response To Office Action, Jan. 6, 2009, U.S. Appl. No. 11/716,115, 24 pgs.
Quevy et al., RCE, Jul. 1, 2009, U.S. Appl. No. 11/716,115, 2 pgs.
Quevy et al., Notice of Allowance, Aug. 10, 2009, U.S. Appl. No. 11/716,115, 7 pgs.
Shen et al, "Thermal Effects On Coated Resonant Microcantilevers", Sensors And Actuators A 95, 2001, 7 pgs.
Quevy et al., "Redundant MEMS Resonators For Precise Reference Oscillators", IEEE Radio Frequency Integrated Circuits Symposium 2005, 4 pgs.
Omura et al., "New Resonant Accelerometer Based On Rigidity Change", IEEE, International Conference On Solid-State Sensors And Actuators, 1997, 4 pgs.
Jianqiang et al., "Dependence Of The Resonance Frequency Of Thermally Excited Microcantilever Resonators On Temperature", Sensors And Actuators A 101, 2002, 5 pgs.
Guckel et al., "Diagnostic Microstructures For The Measurement Of Intrinsic Strain In Thin Films", J. Micromech, Microeng 2, 1992, 10 pgs.
Quevy et al., Notice of Allowance, Apr. 7, 2009, U.S. Appl. No. 11/716,115, 7 pgs.
Bernstein, "MEMS Structure Having A Stress-Inducer Temperature Compensated Resonator Member", U.S. Appl. No. 12/201,819, filed Aug. 29, 2008, 63 pgs.
Bernstein, "MEMS Structure Having A Stress-Inducer Temperature Compensated Resonator Member", U.S. Appl. No. 12/201,819, Office Action, filed Jan. 11, 2011, 9 pgs.
Bernstein, "MEMS Structure Having A Stress-Inducer Temperature Compensated Resonator Member", U.S. Appl. No. 12/201,819, Amendment and Response to Office Action, filed Feb. 11, 2011, 17 pgs.
Bernstein, "MEMS Structure Having A Stress-Inducer Temperature Compensated Resonator Member", U.S. Appl. No. 12/201,819, Notice of Allowance, Mailed Mar. 17, 2011, 11 pgs.
Motiee et al., "MEMS Structure Having A Stress Inverter Temperature Compensated Resonator Member", U.S. Appl. No. 12/204,713, filed Sep. 4, 2008, 56 pgs.
Motiee et al., "MEMS Structure Having A Stress Inverter Temperature Compensated Resonator Member", U.S. Appl. No. 12/204,713, Office Action, Nov. 15, 2010, 12 pgs.
Motiee et al., "MEMS Structure Having A Stress Inverter Temperature Compensated Resonator Member", U.S. Appl. No. 12/204,713, Amendment and Response To Office Action, filed Feb. 11, 2011, 11 pgs.
Motiee et al., "MEMS Structure Having A Stress Inverter Temperature Compensated Resonator Member", U.S. Appl. No. 12/204,713, Notice of Allowance, Mailed Apr. 18, 2011, 9 pgs.
Quevy et al., "Method For Temperature Compensation In Mems Resonators With Isolated Regions Of Distinct Material", U.S. Appl. No. 12/638,919, filed May 9, 2012, 8 pgs.
Quevy et al., "Method For Temperature Compensation In Mems Resonators With Isolated Regions Of Distinct Material", U.S. Appl. No. 12/638,919, Amendment, Aug. 9, 2012, 10 pgs.
Quevy et al., "Method For Temperature Compensation In Mems Resonators With Isolated Regions Of Distinct Material", U.S. Appl. No. 12/638,919, Office Action, Dec. 3, 2012, 5 pgs.
Quevy et al., "Method For Temperature Compensation In Mems Resonators With Isolated Regions Of Distinct Material", U.S. Appl. No. 12/638,919, Amendment, Jan. 25, 2013, 9 pgs.
Quevy et al., "Method For Temperature Compensation In Mems Resonators With Isolated Regions Of Distinct Material", U.S. Appl. No. 12/638,919, Notice of Allowance, Feb. 20, 2013, 3 pgs.
Humad et al., "High Frequency Micromechanical Piezo-On-Silicon Block Resonators", IEEE, 2003, 5 pgs.
Quevy, "Method For Temperature Compensation In MEMS Resonators With Isolated Regions Of Distinct Material", Serial No. 950,519, Filed Nov. 19, 2010, Office Action, Jul. 12, 2013, 18 pgs.

* cited by examiner

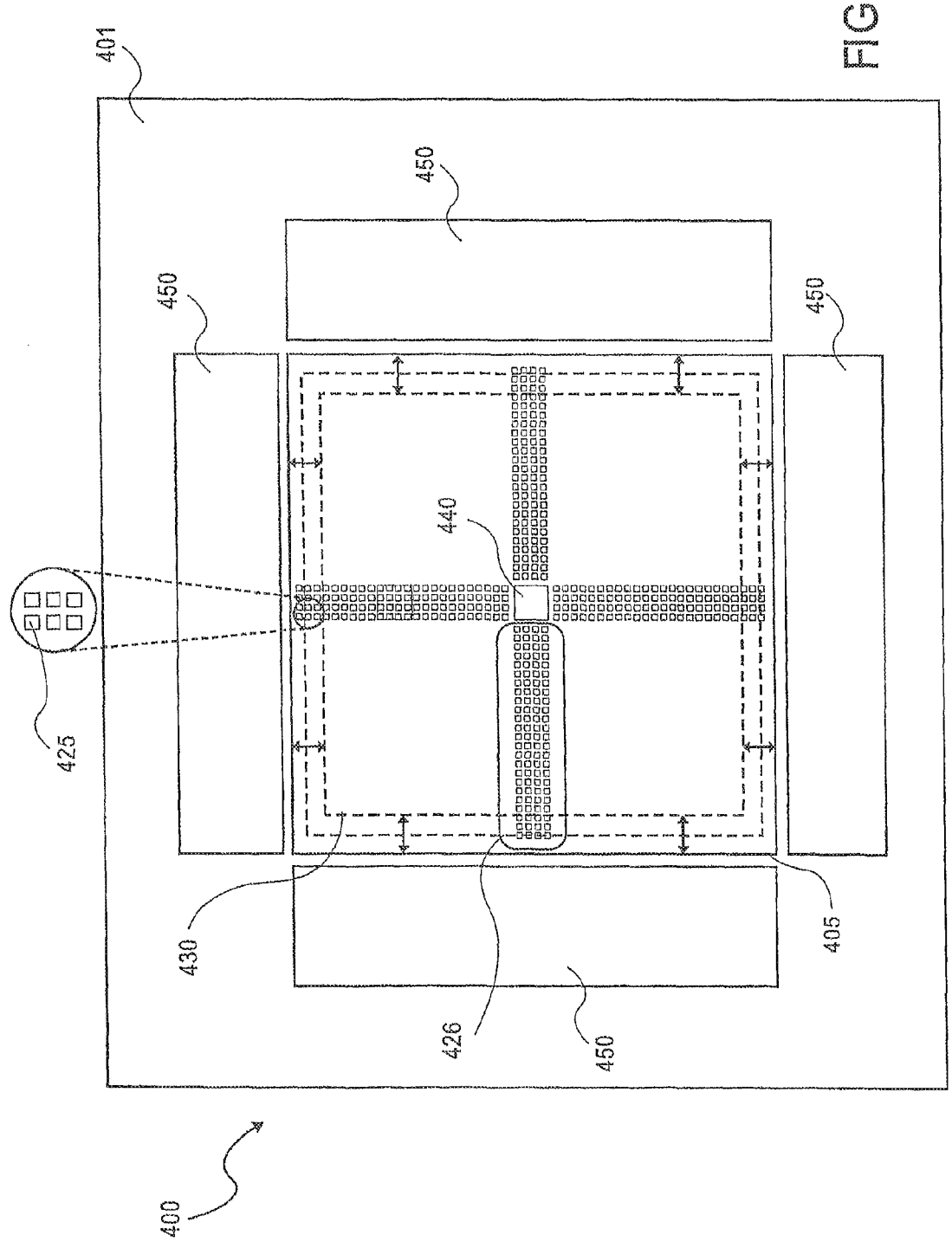

METHOD FOR TEMPERATURE COMPENSATION IN MEMS RESONATORS WITH ISOLATED REGIONS OF DISTINCT MATERIAL

CROSS REFERENCE TO RELATED APPLICATIONS

This patent application is a divisional application of U.S. Application Ser. No. 12/638,919, now U.S. Pat. No. 8,464,418, filed Dec. 15, 2009, which is a divisional application of U.S. Application Ser. No. 11/716,115, filed Mar. 9, 2007, now U.S. Pat. No. 7,639,104, the entire contents and disclosure of each of the foregoing being incorporated herein by reference in its entirety for all purposes.

BACKGROUND

1. Field

The present invention relates to the field of microelectromechanical systems (MEMS), and more particularly to temperature compensated MEMS resonators.

2. Discussion of Related Art

"MEMS" generally refers to apparatus incorporating some mechanical structure having a dimensional scale that is comparable to microelectronic devices. For example, less than approximately 250 um. This mechanical structure is typically capable of some form of mechanical motion and is formed at the micro-scale using fabrication techniques similar to those utilized in the microelectronic industry such as thin film deposition, and thin film patterning by photolithography and reactive ion etching (RIE). The micromechanical structure in a MEMS distinguishes a MEMS from a microelectronic device.

Certain MEMS include a resonator. MEMS resonators are of particular interest in timing devices for an integrated circuit (IC). The resonator may have a variety of physical shapes, such as, but not limited to, beams and plates. Beams may be anchored on two ends or just one. A beam anchored at only one end is frequently referred to as a cantilevered beam. MEMS 100, employing a conventional beam resonator, is shown in FIG. 1A. MEMS 100 includes over substrate 101, drive/sense electrodes 150 and a beam resonator 105. A cross-sectional view along the line a-a' of beam resonator 105 depicted in Figure 1A is shown in FIG. 1B. As the cross-section view shows, beam resonator 105 comprises a single material 130.

A resonator has resonant modes (e.g. flexural, bulk, etc.) of particular frequencies that depend at least upon the physical shape, size and stiffness of the material employed for the resonator. The stiffness of a material, characterized as Young's modulus, is generally temperature dependent.

For a MEMS resonator, such as beam resonator 105, comprising a single material and therefore having uniform density and mechanical properties, the frequency of all modes and shapes can be derived to be a function of the material Young's modulus, E, the density, $\rho$, and a dimensionless constant, $\kappa$, or:

$$f = \frac{\kappa}{\Lambda(d_i)} \sqrt{\frac{E}{\rho}} \quad \text{(Equation 1)}$$

In Equation 1, $\Lambda(d_i)$ is a function of the geometric dimensions $d_i$ of the resonator and has units of length.

The temperature dependence of the resonator frequency is independent of the form of $\Lambda(d_i)$ assuming a linear temperature dependence for these quantities of the form:

$$E(T) = E_0(1 + \gamma(T - T_0)) \quad \text{(Equation 2)}$$

$$d_i(T) = d_i^0(1 + \alpha(T - T_0)) \quad \text{(Equation 3)}$$

$$\rho(T) = \rho_0(1 - 3\alpha(T - T_0)) \quad \text{(Equation 4)}$$

so that:

$$\frac{1}{E}\frac{\partial E}{\partial T}\bigg|_{T=0} = \gamma, \; \frac{1}{d_i}\frac{\partial d_i}{\partial T}\bigg|_{T=0} = \alpha, \; \frac{1}{\rho}\frac{\partial \rho}{\partial T}\bigg|_{T=0} = -3\alpha. \quad \text{(Equation 5)}$$

The temperature dependence of resonator frequency may then be expressed in terms of the linear coefficient of thermal expansion (CTE), $\alpha$, and the Young's modulus temperature coefficient, $\gamma$:

$$f(T) = f_0\left(1 + \frac{1}{2}(\gamma + \alpha)(T - T_0)\right) \quad \text{(Equation 6)}$$

Typical resonators, comprising semiconductor materials, such as single crystalline or polycrystalline silicon, have a Young's modulus that decreases with temperature. Thus, resonators comprising such a resonator will generally have a resonant frequency that decreases with increasing temperature. For an exemplary polycrystalline silicon-germanium (SiGe) resonator, the experimentally determined values are $\gamma = -1.075 \times 10^{-4}/°$ C. and $\alpha = 4.52 \times 10^{-6}/°$ C. Because the magnitude of $\gamma$ is approximately 20 times larger than that of $\alpha$, the temperature coefficient of frequency (TCF) is negative for a homogeneous SiGe resonator of any shape and in any mode. Using the values above, the TCF is approximately $-51.49 \times 10^{-6}/°$ C. or $-51.49$ ppm/° C.

Due in part to the temperature dependence of the Young's modulus, fabricating MEMS resonators having temperature sensitivities on the same order of magnitude as existing quartz resonators is therefore challenging. For example, quartz, being relatively temperature stable, has a frequency drift of approximately 0.5 parts per million (ppm) per degree Celsius (° C.), while conventional MEMS resonators consisting of homogeneous materials of uniform density and mechanical properties have drifts on the order of 100 times higher, or 50 ppm/° C. Thus, widespread adoption of MEMS resonators in IC timing devices may require compensating temperature induced frequency variation.

BRIEF DESCRIPTION OF THE DRAWINGS

FIGS. 4A-4B provide a plan view and a cross-sectional view, respectively, of a MEMS plate resonator in accordance with an embodiment of the present invention.

DETAILED DESCRIPTION OF THE PRESENT INVENTION

Figure 1A:
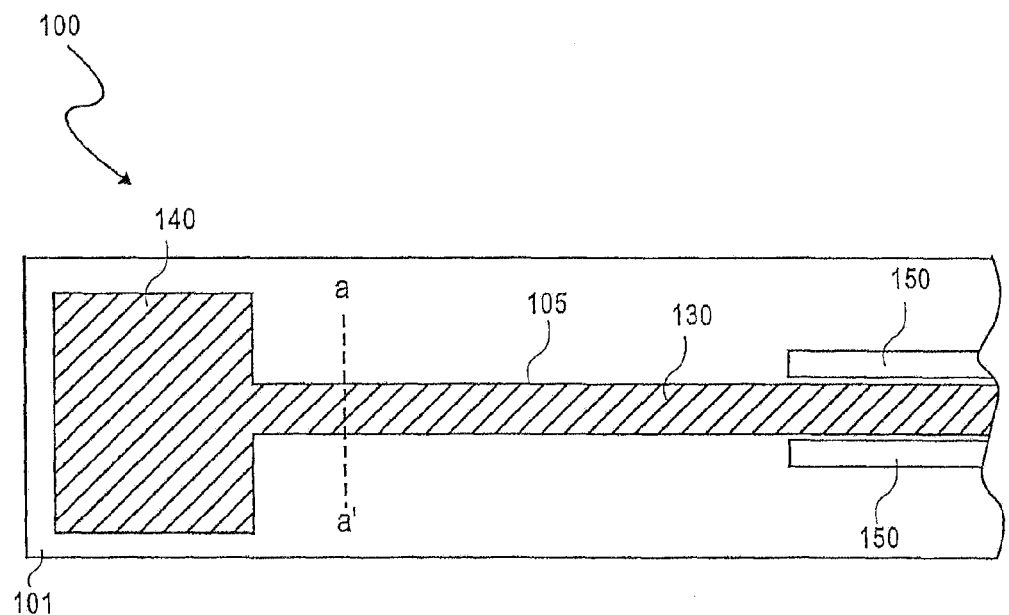
FIG. 1A is a plan view of a MEMS utilizing a conventional uncompensated resonator.
Figure 1B:
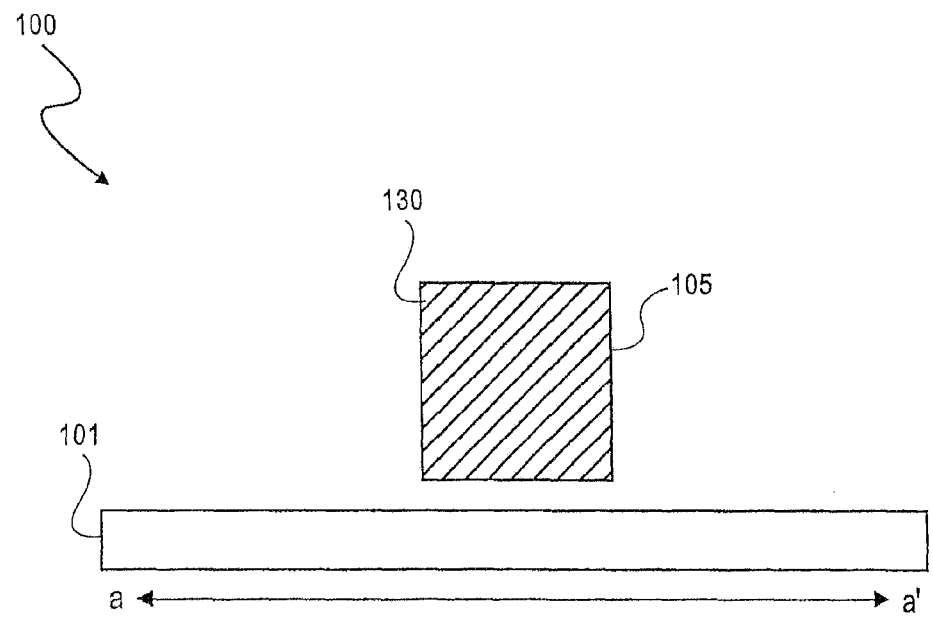
FIG. 1B is a cross-sectional view of the conventional uncompensated resonator depicted in FIG. 1A.

In various embodiments, MEMS resonators are described herein with reference to FIGS. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known manufacturing processes and techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Described herein are MEMS resonators containing a first material and a second material to tailor the resonator's temperature coefficient of frequency (TCF). In one embodiment, the two materials have different Young's modulus temperature coefficients. In one such embodiment, the first material has a negative Young's modulus temperature coefficient and the second material has a positive Young's modulus temperature coefficient. In a further embodiment, the first material is a semiconductor and the second material is a dielectric. In an embodiment, the dimensions and location of the second material in the resonator is tailored to meet the resonator TCF specifications for a particular application. In another embodiment, the second material is isolated to a region(s) of the resonator proximate to a point(s) of maximum stress of the resonator. In a particular embodiment, the resonator includes a first material with a trench containing a second material. In another embodiment the resonator includes a second material adjacent to a sidewall of a first material to form a sidewall of a beam resonator on only a portion of the beam. In a specific embodiment, the shape, dimensions, location and arrangement of a second material comprising silicon dioxide is tailored so that the resonator comprising a first material of SiGe will have a TCF of a much lower magnitude than that of either a homogeneous SiGe or homogeneous silicon dioxide resonator.

Embodiments of the present invention include resonators of any commonly known design such as a cantilevered beam, a beam anchored at two ends, a dual beam tuning fork, as well as a plate resonator and a ring resonator. The resonator may operate in any resonant mode, such as, but not limited to, flexural, bulk, or lame. As two general examples, a flexural mode embodiment employing a beam resonator and a bulk mode embodiment employing a plate resonator are described in detail below.

Figure 2A:
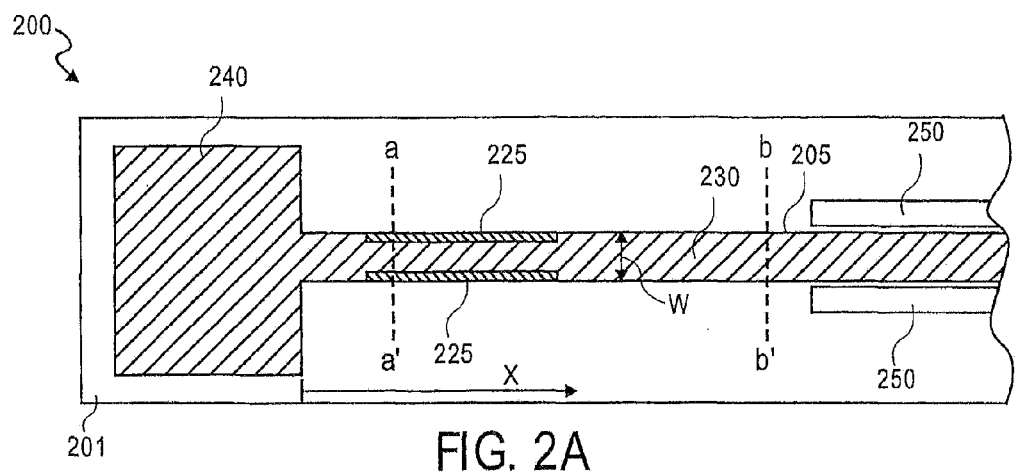
FIG. 2A is a plan view of a compensated MEMS cantilevered beam resonator in accordance with an embodiment of the present invention.

In one embodiment of the present invention shown in FIG. 2A, MEMS 200 employs a beam resonator 205. MEMS 200 has the beam resonator 205 positioned between drive/sense electrodes 250 and connected to substrate 201 by anchor 240. During operation the resonator 205 flexes in-plane with drive/sense electrodes 250 (i.e. in a plane parallel to substrate 201 over which the resonator extends). As shown, the resonator 205 includes a first material 230 and a second material 225.

Hereinafter, references made to "top surface," "bottom surface" and "sidewall" are made relative to a generally planar and horizontally oriented substrate to which the resonator is anchored. Thus, referring to FIG. 2B, "top surface" therefore refers to that surface of the resonator 205 which is opposite substrate 201, while "bottom surface" refers to the surface of the resonator 205 which faces substrate 201. References to "sidewall" refer to surfaces generally perpendicular to substrate 201 (i.e. vertical when substrate is in a typical horizontal orientation).

Embodiments of the present invention employ second material 225 to form the resonator 205. In a particular embodiment, second material 225 has a different Young's modulus temperature coefficient than first material 230. The Young's modulus temperature coefficient of second material 225 need only be different than first material 230 over the operational range of the MEMS. Any material having a different Young's modulus temperature coefficient than first material 230 over the typical operating range of approximately −30° C. to 90° C. may be employed as second material 225. In an embodiment, first material 230 has a negative Young's modulus temperature coefficient, while second material 225 has a positive Young's modulus temperature coefficient. In a further embodiment, first material 230 is a semiconductor such as, but not limited to, silicon (Si), germanium (Ge), and SiGe alloys and second material 225 is amorphous silica (silicon dioxide, $SiO_2$). In one such SiGe embodiment, first material 230 is an alloy composition of approximately 35% silicon and 65% germanium with a boron doping while second material 225 is silicon dioxide. Silicon dioxide has the unusual property of becoming stiffer as temperature increases. For example, an experimentally determined value of $\gamma$ for silicon dioxide is $\gamma_{oxide}=1.73\times 10^{-4}/°$ C. Hence, a resonator made of only oxide would have a positive TCF of approximately 86.5 ppm /° C. In an alternate embodiment, second material 225 is diamond.

Generally, embodiments of the present invention have a resonator structure primarily formed of first material 230 with second material 225 selectively located to specific regions of the resonator 205 and dimensioned to modify the temperature response of the resonator 205 independent of other properties of the resonator. Thus, second material 225 is selectively located to provide temperature compensation to the resonator 205 in a non-global manner (i.e. second material 225 need not be formed along the entire length of the resonator in any dimension). In this manner, the mode temperature behavior of the resonator can be tailored. These embodiments enable tailoring of the resonator TCF without detrimentally affecting the Q of the resonator. For example, second material 225 may be isolated to specific areas of the resonator 205 to reduce changes to the resonator's mode shape by reducing the effects of sound velocity mismatch between second material 225 and first material 230. Selectively locating second material 225 only to isolated regions decouples the effect of the second material's TCF from the effect of other temperature dependent properties of the second material. For example, where second material 225 has a significantly different temperature coefficient of expansion (TCE) than first material 230, isolation of second material 225 to specific regions reduces the effect on the TCF of the resonator that strain from the TCE mismatch between the materials has.

In one embodiment, second material 225 is located in a region(s) of the resonator 205 proximate to a point(s) of maximum stress within the resonator during operation of the resonator.

In a further embodiment, second material 225 is located in a region(s) of the resonator 205 proximate to a point(s) of maximum stress and minimum displacement within the resonator during operation of the resonator. Multiple points of maximum stress may exist where symmetrical points of the resonator experience equivalent stresses. The point(s) of maximum stress and/or minimum displacement is dependent on the design of the resonator and may be approximated for a particular resonator design through mathematical modeling. Such modeling can be accomplished by various known computational techniques, such as finite element analysis (FEA). An optimization may then be performed to both locate and dimension second material 225 proximate to the point(s) where stress is greatest and/or where displacement is at a minimum. In the embodiments shown in FIGS. 2A-2C and 3A, second material 225 is isolated to opposite sidewalls of the beam resonator 205 in a region of the beam proximate to anchor 240. As a further illustration, in an alternate embodiment (not shown), a resonator designed to operate in a vertically oriented flexural mode (where flex of the beam is away from and toward the general plane of the substrate to which the resonator is anchored), second material 225 is located on at least the top surface of the resonator (i.e. parallel to the substrate 201 and perpendicular to the sidewalls of the beam resonator) to enhance the longitudinal stiffness of the resonator in the dimension where flexural stress is greatest.

Figure 2B:
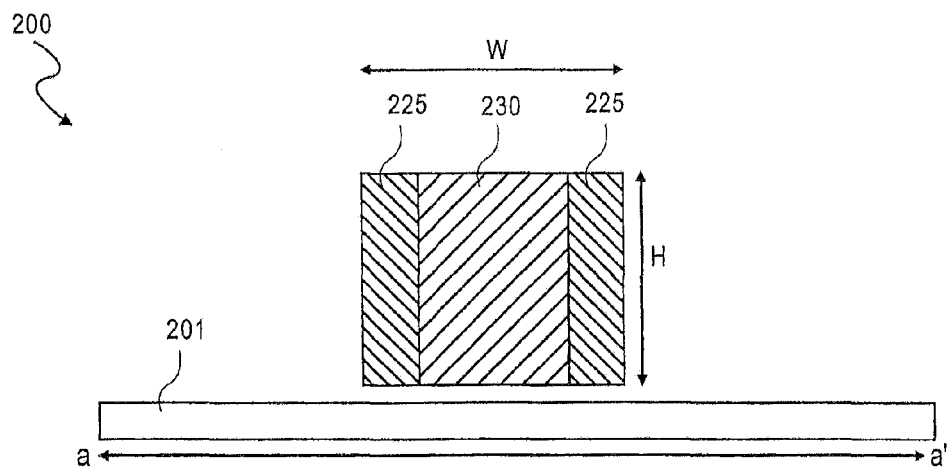
FIG. 2B is a cross sectional view of the compensated MEMS cantilevered beam resonator depicted in FIG. 2A.

In the embodiment shown in FIG. 2A, the extent of the longitudinal stiffness provided by second material 225 is tailored by dimensioning the length, in the direction X, and thickness, in the direction W, of material 225. As shown in FIG. 2B, second material 225 is adjacent to sidewalls of first material 230 to form sidewalls of the resonator 205 extending along the height, H. In this embodiment, opposite sidewalls of the resonator comprising second material 225 enhance the longitudinal stiffness of the resonator along a portion of the beam length along X, shown in FIG. 2A, influencing the resonant frequency as a function of temperature. The thickness of second material 225, in the direction W, is selected to provide the longitudinal stiffness in second material 225 required for the desired modification of resonator TCF.

In an embodiment, the second material is at least partially contained within a trench in the first material. Embodiments at least partially embedding second material 225 in a trench in first material 330 increases the ability counter the Young's modulus temperature coefficient of first material 230 because stress loading on second material 225 during resonator operation becomes more normal or less shear. Herein, the meaning of a trench is a lithographically defined depression in first material 230 extending through at least a portion of first material 230. In particular embodiments, the trench extends entirely through first material 230. Embedding second material 225 in the trench essentially forms a plug of second material 225 extending between the top surface and bottom surface of first material 230. Alternatively, embedding second material 225 in the trench fills a well having a bottom floor comprising first material 230. A trench may be of any general shape, such as, round square or annular (i.e. a ring).

Figure 2C:
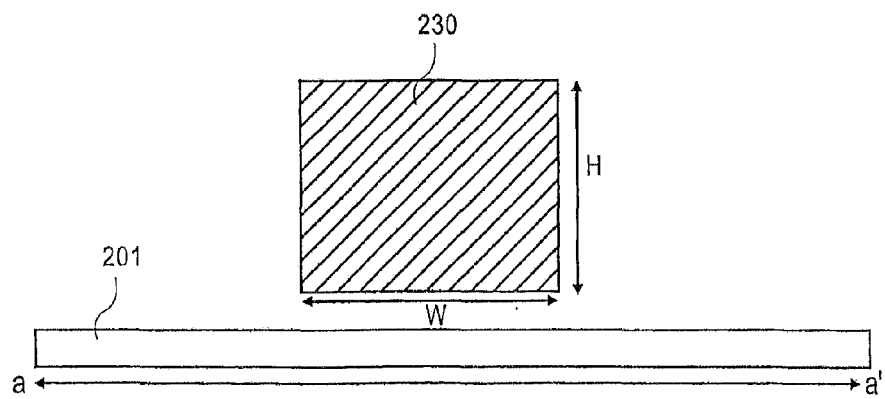
FIG. 2C is a plan view of a compensated MEMS cantilevered beam resonator in accordance with an embodiment of the present invention.

As shown in FIG. 2A, second material 225 is embedded into first material 230 to form a beam resonator where the cross section of first material 230 varies along length of the beam, L. In one such embodiment, the beam resonator has constant cross-sectional area, W*H, as shown in FIGS. 2B and 2C, along a length of the beam, X. FIG. 2B depicts a cross-section of the beam along the a-a' line shown in FIG. 2A while FIG. 2C depicts a cross-section of the beam along the b-b' line shown in FIG. 2B. Thus, the cross-sectional area, W*H, of the beam is the same in both in a region of the beam having the second material 225 and a region of the beam having only first material 230. In an alternate embodiment (not shown), second material 225 is embedded into first material 230 to form a beam resonator where both the cross sectional area of first material 230 and cross-sectional area, W*H, of the resonator varies along the beam length direction X. Here, the cross-sectional area, W*H, of the resonator may increase to the extent the thickness of second material 225 exceeds the amount the trench in first material 230 reduces the W dimension of first material 230. Such an embodiment is advantageous when the W dimension of the resonator is not sufficient to completely incorporate the thickness of second material 225 necessary to provide first material 230 with the longitudinal stiffness required for the desired modification of resonator TCF.

Although not explicitly depicted, it should also be appreciated that selectively locating second material 225 adjacent to first material 230 without embedding second material 225 in first material 230 is also within the scope of the present invention. In such an embodiment, the resonator includes a second material adjacent to a sidewall of a first material to form a sidewall of a beam resonator on only a portion of the beam along the length direction X. For example, relative to the MEMS 205 shown in FIG. 2A, first material 230 would have a constant cross sectional area between a-a' and b-b'. Thus, at a-a', second material 225 would increase the W dimension of the beam by the thickness of second material 225.

Just as second material 225 may extend outward in the W direction beyond the sidewall of first material 230 (referring to FIG. 2B), second material 225 may also have a greater or lesser height (i.e. depth) in the H direction such that the top surface of second material 225 is not planar with the top surface of first material 230. In the particular embodiments shown, however, the top surfaces of first material 230 and second material 225 are planar with each other.

Figure 3A:
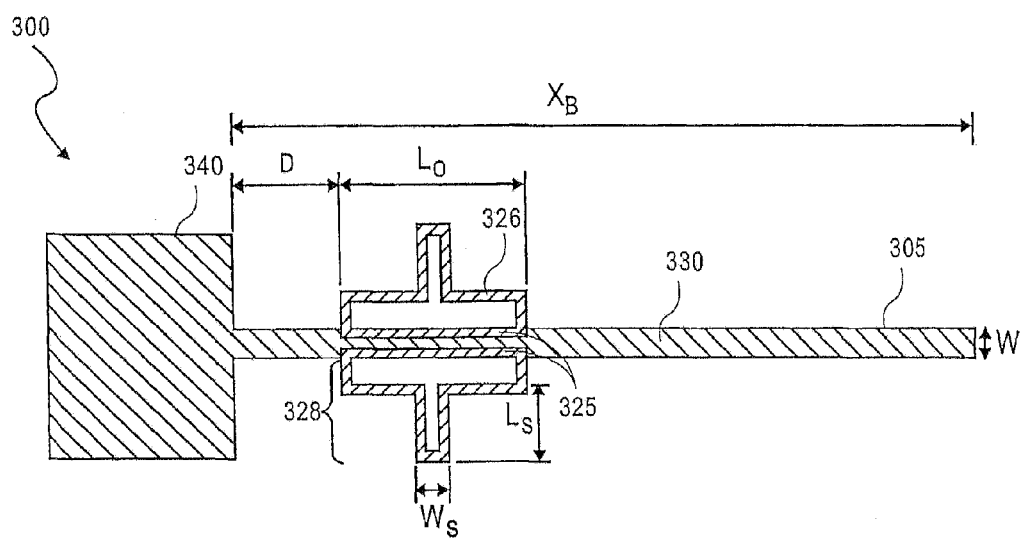
FIG. 3A is a plan view of a compensated MEMS cantilevered beam resonator in accordance with an embodiment of the present invention.
Figure 3B:
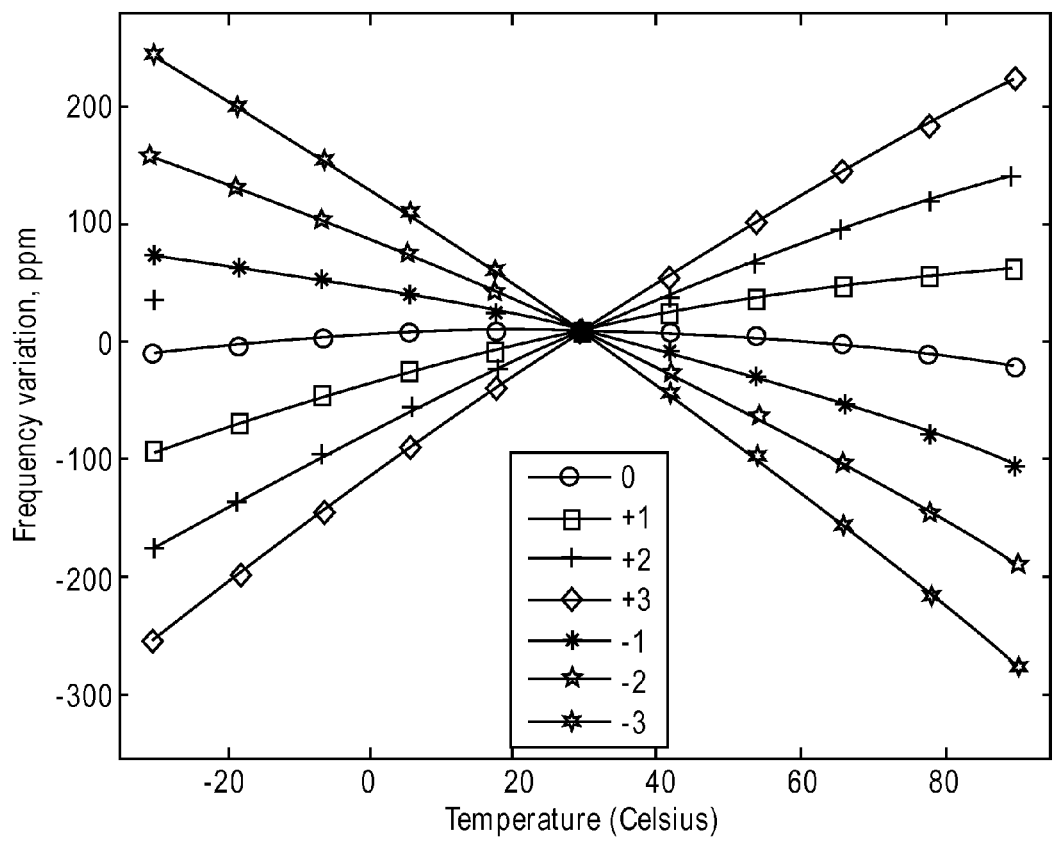
FIG. 3B is a graphical result of a mathematical simulation of the frequency variation over a temperature range for a MEMS cantilevered beam resonator depicted in FIG. 3A.

In an exemplary embodiment depicted in FIGS. 3A and 3B, the TCF of MEMS 300 employing a SiGe beam resonator is tailored by selectively positioning on the beam a silicon dioxide region with a specific length and width. As shown in FIG. 3A, a SiGe beam resonator 305 is connected to anchor 340. The SiGe beam resonator 305 has a beam length, $X_B$, of 147.8 um, a width, W, of 1.5 um and a height (in the H direction of FIG. 2B) of 2 um. At a 5 um distance D from the anchor, silicon dioxide 325 is incorporated into the resonator 305 for temperature compensation of the resonant frequency. Silicon dioxide 325 is embedded in trenches or notches formed in SiGe 330. Silicon dioxide 325 has a nominal length, $L_O$, of 31.4 um, a thickness in the W direction of 0.6 um and a height of 2 um.

Attached to silicon dioxide 325 to form an annular structure attached to each side of the resonator 305 is artifact 326. Artifact 326 is residual silicon dioxide resulting from a particular manufacturing method described in further detail below. Artifact 326 has been dimensioned and shaped to serve as a low compliance spring 328 which allows the portion of the annulus of silicon dioxide 325 not in direct contact with SiGe 330 (artifact 326) to bend. In the particular embodiment shown, the length of spring 328, $L_S$, is 10 um and spring width, $W_S$, of 2 um. However the length and placement of spring 328 are not important to the temperature compensation of the resonator 305, as long as the stiffness of spring 328 is negligible compared to the longitudinal stiffness of silicon dioxide 325 in contact with SiGe 330. Furthermore, it should be appreciated the silicon dioxide 325, as an electrical insulator, may be additionally employed to electrically isolate two regions of the resonator 305, The graph of FIG. 3B depicts finite element simulations for the resonator described in FIG. 3A. In FIG. 3B, resonant frequency of the resonator as a function of temperature is graphed for various lengths, $L_O$, of silicon dioxide 325. The curve marked with open circles shows the temperature dependence for the nominal length of $L_O$=31.4 um. As can be seen, the variation of frequency with temperature is much smaller than the 5000 ppm of a resonator comprising only SiGe over the same 120° C. temperature range. Increasing the length $L_O$ by one micron (curve marked by "+1" in FIG. 3) makes the temperature coefficient slightly positive (approximately 2 ppm/° C.), while decreasing the length has the opposite effect.

FIG. 4A depicts MEMS bulk mode resonator 400 employing a plate 405 with an anchor 440 to substrate 401 surrounded by drive/sense electrodes 450. The mode of the resonator depends on the voltage phase of electrodes 450. The dashed lines depict a resonant mode whereby all sides compress and extend in unison. In the embodiment shown, the plate resonator 405 comprises second material 425 contained in trenches in first material 430 to form an isolated block or a plurality of isolated blocks. Generally, the composition, size and shape of the blocks, as well as the arrangement of a plurality of blocks has an influence on the temperature behavior of the structure, and can alter the mode shape that the structure would have. As one of ordinary skill in the art will appreciate, the benefits of selectively locating and dimensioning second material 425 are in many ways analogous to those previously described in the context of a beam resonator. Of course, other bulk mode resonators such as rings, disks or any other shape may employ second material 425.

Similar to the beam resonator embodiments previously discussed, in one plate resonator embodiment, first material 430 has a negative Young's modulus temperature coefficient, while second material 425 has a positive Young's modulus temperature coefficient. In one such embodiment, first material 430 is a semiconductor such as, but not limited to, Si, Ge, and SiGe alloys, while second material 425 is amorphous silica (silicon dioxide).

In one embodiment, second material 425 is arranged into a radial array to modify the temperature behavior of the resonator with minimal impact to the mode shape of the resonator. in alternate embodiments, the mode shape of the resonator is deliberately altered through arrangement of the blocks of second material 425. As shown in FIG. 4A, second material 425 is selectively located in a trench in first material 430 to form a plurality of isolated regions, or blocks, of second material 425 arranged in a radial array 426 about anchor 440. As shown, the radial arrays are configured to bisect each side of the plate resonator 405. Such a configuration of second material 425 is dependent on the mode of the resonator, which in this embodiment is represented by the dashed lines. In one such embodiment, first material 430 forms a 60 um square plate, 2 um thick and with a central anchor 440 of 12 um on a side. The plate resonator 405 includes a set of 1 um square blocks of second material 425 arranged in four radial arrays of 4 by 21 blocks embedded in trenches within first material 430.

Figure 4B:
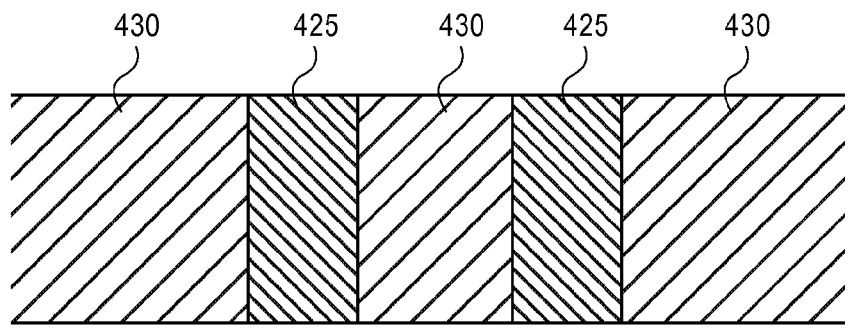

As depicted in FIG. 4B, second material 425 fills a trench in first material 430. In other embodiments, second material 425 may merely form an annular spacer structure along the inner edge of the trench. Furthermore, the trench itself may be of any general shape, such as, round square, annular, etc. In still other embodiments, second material 425 may further comprise a composite of two or more material layers. In one embodiment, the top surface of second material 425 is planar with first material 430. In an alternate embodiment, the top surface of second material 425 extends above or below the top surface of first material 430. As shown, the trench in first material 430 extends through first material 430 such that second material 425 forms a block extending between the top surface and bottom surface of first material 430. However, in other embodiments, the trench containing second material 425 only extends through a portion of first material 430 such that second material 425 fills a well or depression having a bottom floor comprising first material 430.

Figure 4C:
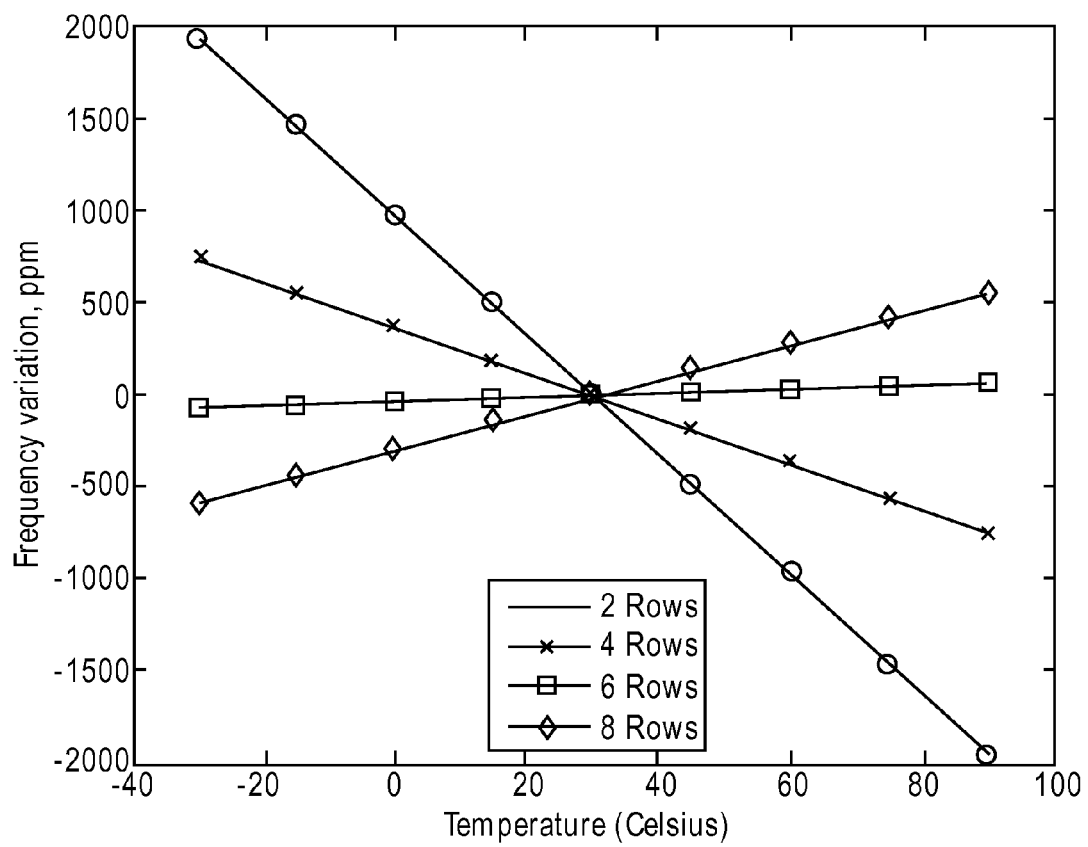
FIG. 4C is a graphical result of a mathematical simulation of frequency variation over a temperature range for a MEMS plate resonator in accordance with an embodiment of the present invention.

In a further embodiment, the arrangement of the individual blocks of second material 425 forming an array 426 in first material 430 is predetermined to provide the desired modification to the TCF of the resonator. The array 426 of second material 425 is arranged to have a number of rows of with a particular spacing or density. Shown in FIG. 4C, finite element simulations of a 60 um square plate of 2 um thick SiGe show the frequency of a resonant mode as a function of temperature for various arrays of silicon dioxide blocks. As the number of rows of blocks is increased from two to eight, the slope of the frequency vs. temperature curve changes from negative to positive. In the embodiment with six rows of blocks is approximately 1 ppm/° C., or about 50 times smaller than for a plate of exclusively SiGe.

Figure 5:
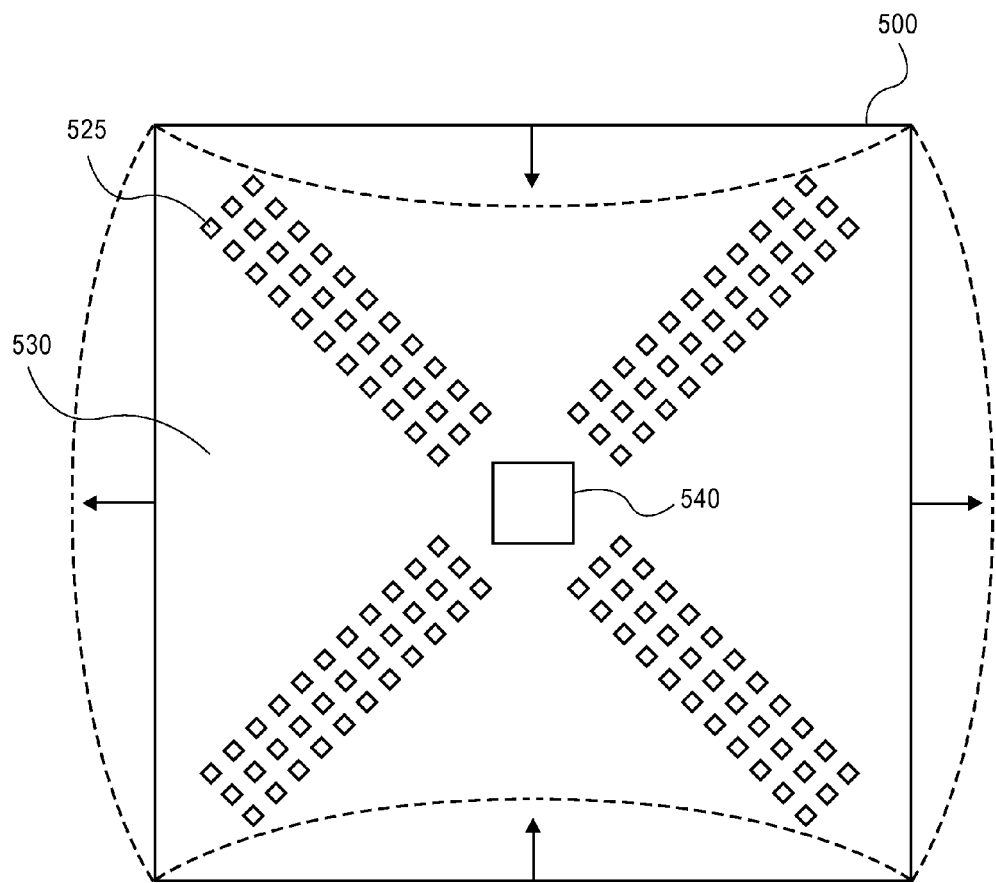
FIG. 5 is a plan view of a MEMS plate resonator in accordance with an embodiment of the present invention.

In particular embodiment, the second material is selectively located and dimensioned based on the desired resonant mode. For example, another bulk mode resonator design is depicted in FIG. 5. The resonator employs a plate 500 with an anchor 540. Here, the resonator is operated in a mode wherein some sides of the plate extend while others compress, as depicted by the dashed lines. Resonator plate 500 is comprised primarily of first material 530 with second material 525 embedded into trenches in first material 530. In this embodiment, the regions of second material 525 are arranged into radial arrays oriented on the diagonal of plate 500. Thus, as depicted in FIGS. 4A and 5, the specific locations of regions of second material 525 is predetermined based on the resonant mode shape. Furthermore, each isolated region of second material may be individually positioned relative to other isolated regions of second material to tune the temperature coefficient of frequency of the resonator comprised of both first and second material. In this manner additional degrees of design freedom are provided.

FIGS. 6A-6E, 7A-7E, 8A-8F and 9A-9C are prospective views of methods for fabricating resonators in accordance with an embodiment of the present invention. FIGS. 6A-6E depict a first method to selectively fabricate a second material in a first material to form a compensated resonator.

Figure 6A:
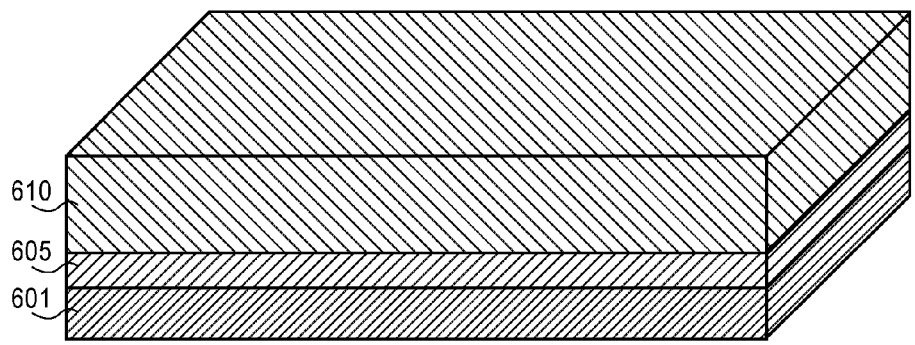
FIGS. 6A-6E are prospective views of a method of fabricating resonators in accordance with an embodiment of the present invention.

As shown in FIG. 6A, on substrate 601, barrier layer 605 is deposited. Substrate 601 may be any commonly known semiconductor substrate, such as, but not limited to, single crystalline silicon, germanium or a silicon/germanium layer. Substrate 601 may alternatively be comprised of a III-V material such as but not limited to gallium nitride, gallium phosphide, gallium arsenide, indium phosphide or indium antimonide. Moreover, substrate 601 may comprise an insulating layer such as silicon dioxide or silicon nitride embedded below a monocrystalline semiconductor layer to form, for example, a silicon on insulator or germanium on insulator substrate. Substrate 601 may further be an insulator such as glass, sapphire, or quartz.

Barrier layer 605 may be an etch stop layer or sacrificial layer to be subsequently removed to release the resonator. Barrier layer 605 may have any commonly known composition, such as, but not limited to, silicon dioxide, silicon oxy nitride, silicon nitride, germanium, silicon, and silicon germanium alloys. Barrier layer 605 may be formed by any commonly known technique, such as, but not limited to, chemical vapor deposition (CVD), low pressure CVD (LP-CVD), plasma enhanced (PE) CVD, physical vapor deposition (PVD), evaporation, and electrochemical deposition. In a particular embodiment, barrier layer 605 is of a material which can be formed at a relatively low temperature, below approximately 500° C., to be compatible with common BEOL processes. In one such embodiment, barrier layer 605 is greater than 98% germanium atoms and boron dopant impurity atoms having a total atomic concentration in the range of $5 \times 10^{19}$-$5 \times 10^{20}$ atoms/cm$^3$ deposited at a temperature of approximately 350° C. using a LPCVD process.

Upon barrier layer 605, first material layer 610 is formed as a structural layer of the resonator. First material layer 610 must also endow a resonant Member with good performance metrics, such as, but not limited to, a sufficiently high Q. In certain embodiments, first material layer 610 is deposited at a temperature below 500° C. to be compatible with typical back end of line (BEOL) microelectronics processing. In one embodiment, silicon and/or germanium is deposited by a LPCVD process. In a particular embodiment employing a germanium barrier layer 605, first material layer 610 is polycrystalline alloy of silicon and germanium deposited at a temperature of approximately 425° C. using an LPCVD process.

Figure 6B:
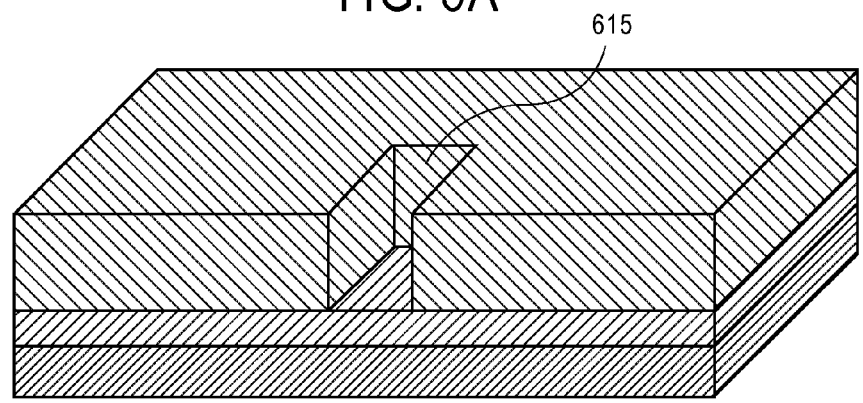

Next, as shown in FIG. 6B, trench 615 is patterned into first material layer 610. Trench 615 may be etched either partially through first material layer 610 or completely to expose barrier layer 605. Patterning of trench 615 may be by any commonly known technique, such as lithographic definition of a masking layers and anisotropic etching by plasma-based etch systems. The dimensions of trench 615 are exactly the dimension needed for the slit pattern to compensate or influence the temperature coefficient of the structure properties according to specifications.

Figure 6C:
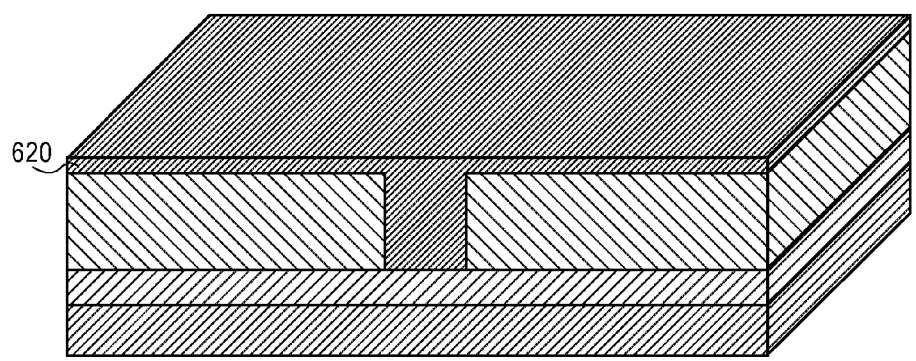

Then, as shown in FIG. 6C, second material layer 620 is deposited conformally or superconformally (bottom-up) to fill substantially void-free the defined trench 615. Second material may be deposited by any conventional means, such as, but not limited to, PVD, PECVD, LPCVD, and electrochemical deposition to fill completely and void-free the defined trench. This can be done as one step, or as sequence of thin deposition and anisotropic etch back steps until the trench is filled. Alternatively, second material 620 may merely be formed by oxidizing first material 610 to form second material 620 on the sidewalls of trench 615. In certain embodiments, second material layer 620 is deposited at a temperature below 500° C. to be compatible with typical back end of line (BEOL) microelectronics processing. In a particular embodiment employing a first material layer 610 of SiGe, silicon dioxide is deposited using a PECVD process at a temperature between 350° C. and 400° C. In still other embodiments, a composite second material 620 comprising a layer silicon dioxide and a layer of another material, such as silicon nitride or a metal, are deposited.

Figure 6D:
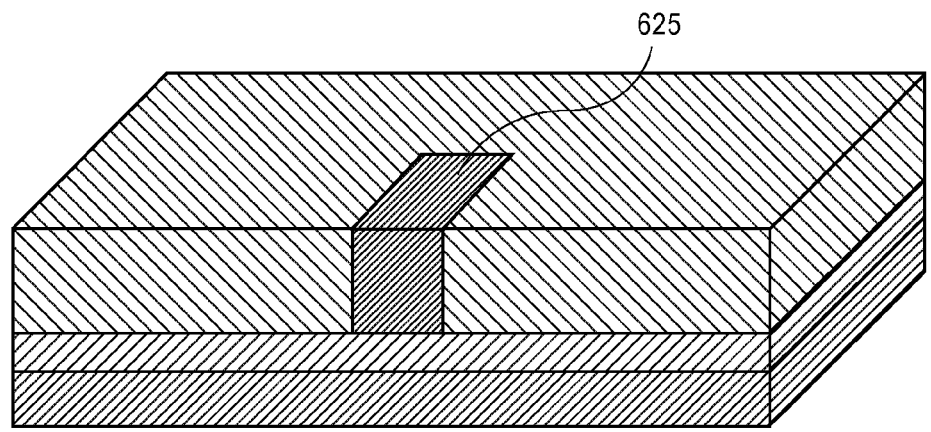

Next, shown in FIG. 6D, second material layer 620 is etched-back or polished away from the top of first material layer 610 using commonly known methods such as chemical-mechanical polishing (CMP) to for the properly dimensioned second material 625. In an alternate embodiment, the top surface of second material layer 620 can also be kept to serve as a hard mask for the subsequent steps.

Figure 6E:
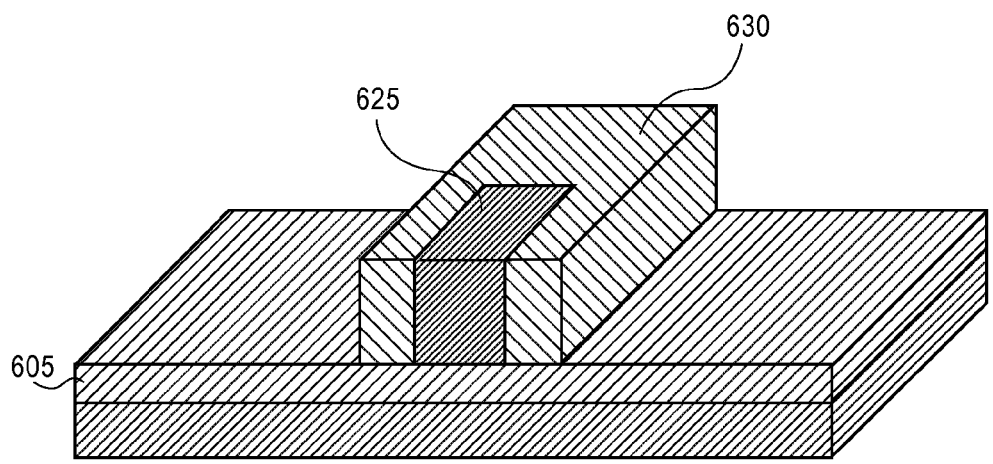

Then, as shown in FIG. 6E, first material layer 610 is patterned to form first material 630 properly dimensioned for the resonator using conventional techniques such as lithographically patterning a masking layer and etching first material layer 610. In a particular embodiment employing SiGe as first material layer 610 and silicon dioxide as second material 625, an anisotropic plasma etch chemistry containing at least one gas selected from the group consisting of xenon difluoride (XeF$_2$), silicon tetrachloride (SiCl$_4$), and chlorine (Cl$_2$) is employed. Additional layers above and below first material 630 can be used to encapsulate second material 625. In the embodiment shown, second material 625 is encapsulated inside first material 630 to avoid exposure of the second material 625 to the environment and avoid stability issues, or simply prevent etching of the secondary material during subsequent steps like release. In an alternate embodiment, second material 625 is not encapsulated in first material 630 and etching of first material layer 610 is performed with a process that is selective to first material layer 610 over second material 625.

FIGS. 7A-7E depict a second method to selectively fabricate a second material in a first material to form a compensated resonator. This second method has the benefit of not requiring the second material to fill a potentially high aspect ratio trench within the first material. To avoid high aspect trenches that can be difficult to fill without voids, this embodiment forms the second material, having smaller dimensions than first material, prior to forming the second material.

Figure 7A:
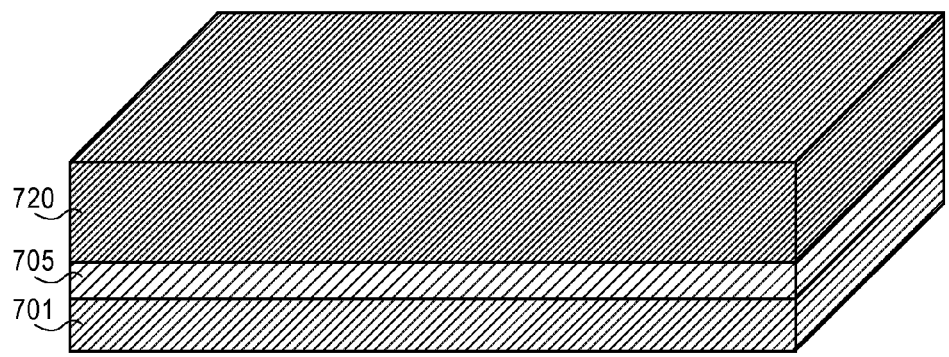
FIGS. 7A-7E are prospective views of a method of fabricating resonators in accordance with an embodiment of the present invention.

As shown in FIG. 7A, second material 720 is deposited on barrier layer 705 over substrate 701. Barrier layer 705 can be a sacrificial layer or an etch stop layer. Substrate 701 and barrier layer 705 may be of any material commonly employed in the art, such as, but not limited to, those described in reference to FIG. 6A. Second material may be deposited by any conventional means, such as, but not limited to, PVD, PECVD, LPCVD, and electrochemical deposition. In a particular embodiment, silicon dioxide is deposited using PECVD process at a temperature between 350° C. and 400° C. In still other embodiments, a composite second material 720 comprising a layer silicon dioxide and a layer of another material, such as silicon nitride or a metal, are deposited.

Figure 7B:
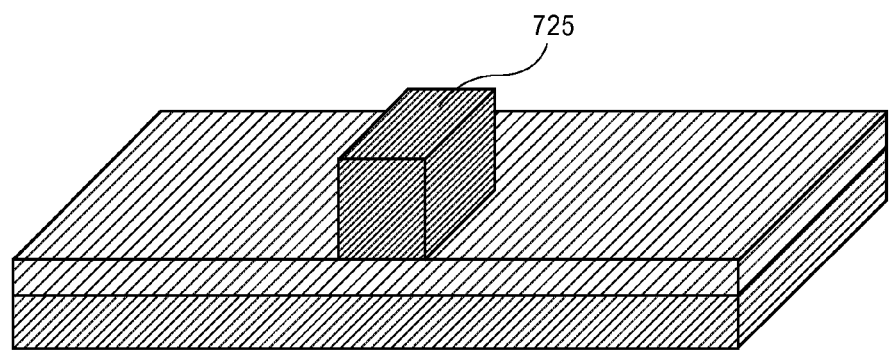

Next, shown in FIG. 7B, second material layer defined and etched into the second material 725 having the exact dimensions needed to compensate or influence the temperature coefficient of the resonator according to specifications. Patterning of second material 725 may be by any commonly known technique, such as lithographic definition of a masking layers and anisotropic etching by plasma-based etch systems. In a particular embodiment, a fluorine-based plasma etch process is employed to etch a silicon dioxide second material 725.

Figure 7C:
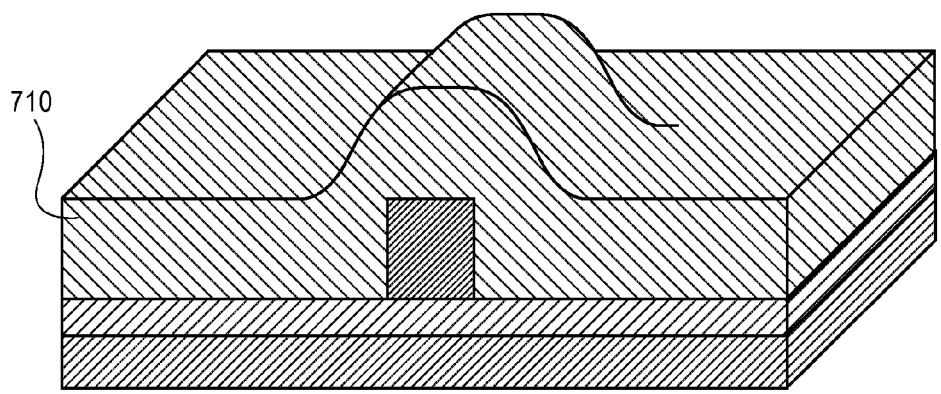
Figure 7D:
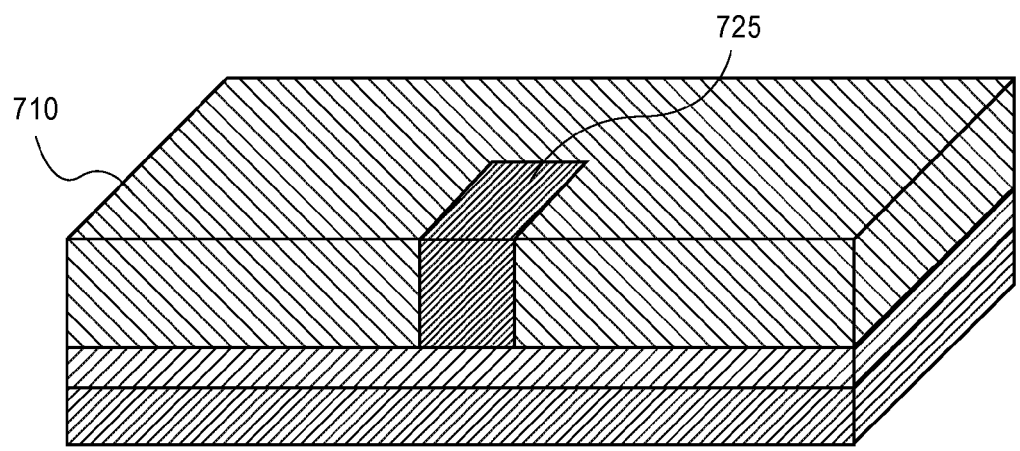
Figure 7E:
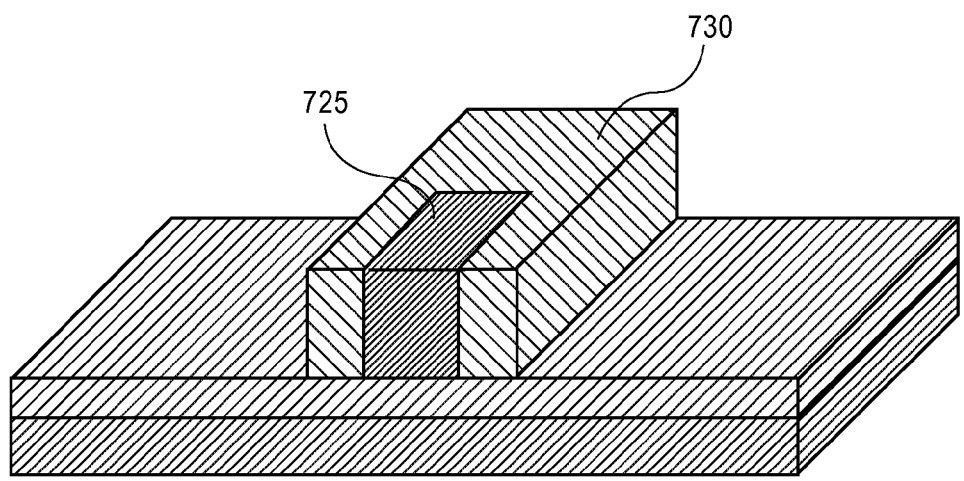

Then, as shown in FIG. 7C, first material layer 710 is deposited in a conformal manner over second material 725. First material layer 710 may be deposited by any commonly known means, such as, but not limited to, those previously described in referenced to FIG. 6B. Next, as depicted in FIG. 7D, first material layer 710 is polished by CMP down to the top surface of second material 725 using commonly known techniques and parameters. Finally, first material layer 710 is patterned using commonly known techniques and methods into first material 730 to form the resonator. The resonator may then be released by removing barrier layer 705 (not shown), as is commonly known in the art.

FIGS. 8A-8F depict a third method to selectively fabricate a second material in a first material to form a compensated resonator. This method relies on a spacer based process so that the thickness of the second material advantageously relies only on the deposition thickness of the second material rather than lithography. Nonetheless, to selectively compensate the resonator in accordance with present invention, the shape, length and location of the second material are still controlled by lithography.

Figure 8A:
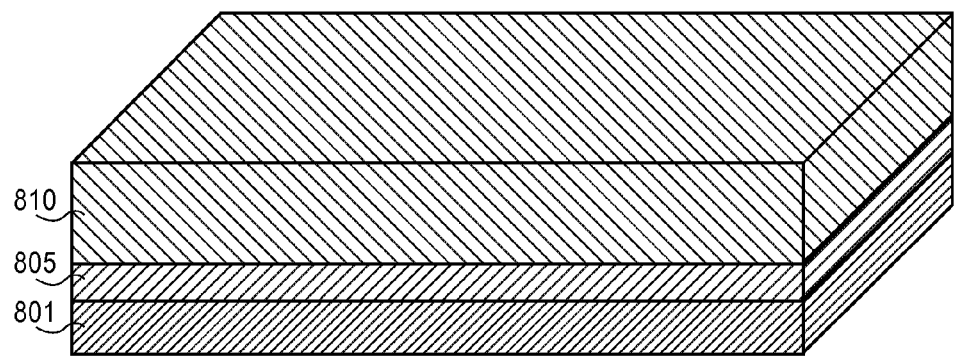
FIGS. 8A-8F are prospective views of a method of fabricating a cantilevered beam resonator in accordance with an embodiment of the present invention.
Figure 8B:
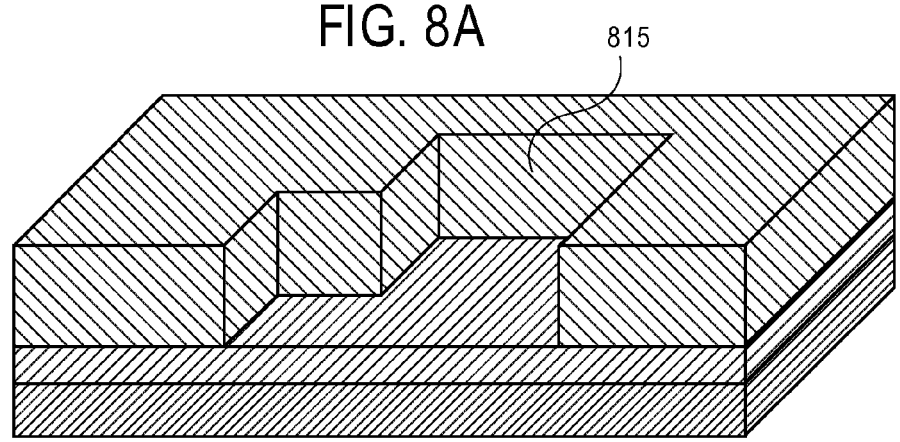

First, as shown in FIG. 8A, first material layer 810 is deposited on barrier layer 805 over substrate 801, just as described in reference to FIG. 7A. Next, FIG. 8B depicts trench 815 lithographically defined and etched into first material layer 810. At least one dimension of the trench is significantly larger than the targeted width of the second material necessary for temperature compensation or temperature coefficient tuning. In one embodiment, the length of one side of trench 815 is the exact length dimension desired for the second material, while the width is much greater than the width dimension desired for the second material.

Figure 8C:
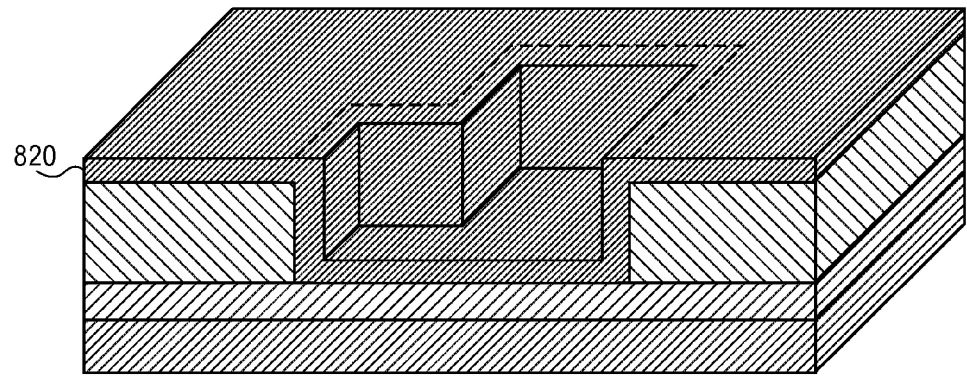

Next, as shown in FIG. 8C, second material layer 820 is deposited in a conformal manner by PVD, PECVD, LPCVD or electrochemical deposition. The thickness of the deposition on the sidewall of the trench determines the width of the second material targeted for temperature compensation or temperature coefficient tuning. This deposition can be done as one step, or as sequence of thin deposition and anisotropic etch back steps until the targeted width is achieved. In still other embodiments, a composite second material 820 comprising a layer silicon dioxide and a layer of another material, such as silicon nitride or a metal, are deposited.

Figure 8D:
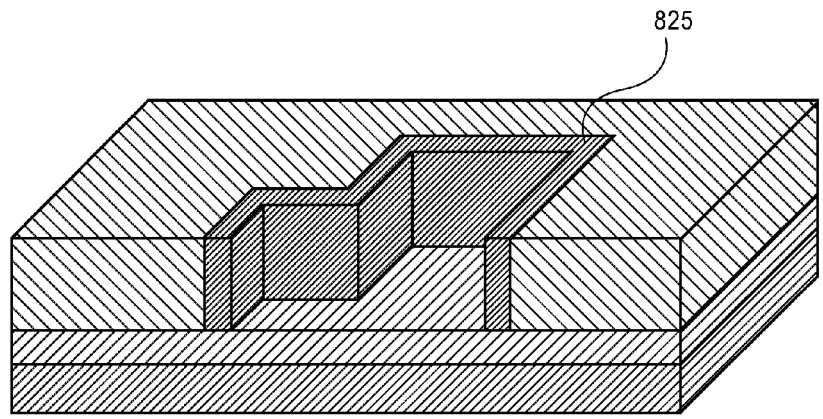

As shown in FIG. 8D, second material layer 820 is removed from the bottom of the trench to avoid strong mechanical coupling between the opposite sidewall of the trench. The top surface of second material layer 820 is also etched-back or polished by CMP to remove the secondary material from the top of the primary structural material, thereby forming second material 825 as a spacer along the edge of the trench. In a particular embodiment, employing a silicon dioxide second material layer 820, a commonly known fluorine-based anisotropic plasma etch forms second material 825 in a manner similar to a spacer etch process common in microelectronics.

Figure 8E:
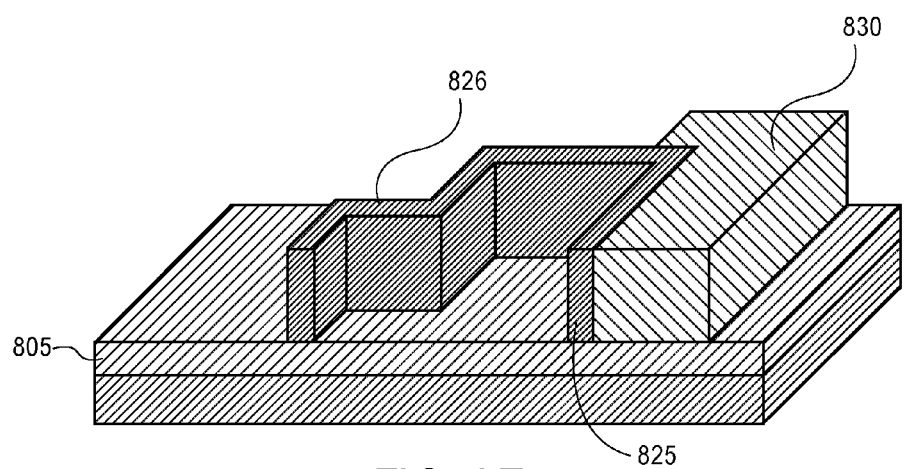

As shown in FIG. 8E, first material layer 810 is patterned into first material 830 having proper dimensions to form the resonator using commonly known lithographic and etch techniques. As shown, remaining attached to first material 830 is second material 825 of the appropriate size to compensate the temperature response of the resonator. Attached to second material 825 is artifact 826 forming an annulus with second material 825. In the embodiment shown, trench 815 of FIG. 8B was patterned in a manner to ensure artifact 826 has a shape and dimensions sufficient to act as a low compliance spring. In this manner, only second material 825 provides compensation to the resonator.

Figure 8F:
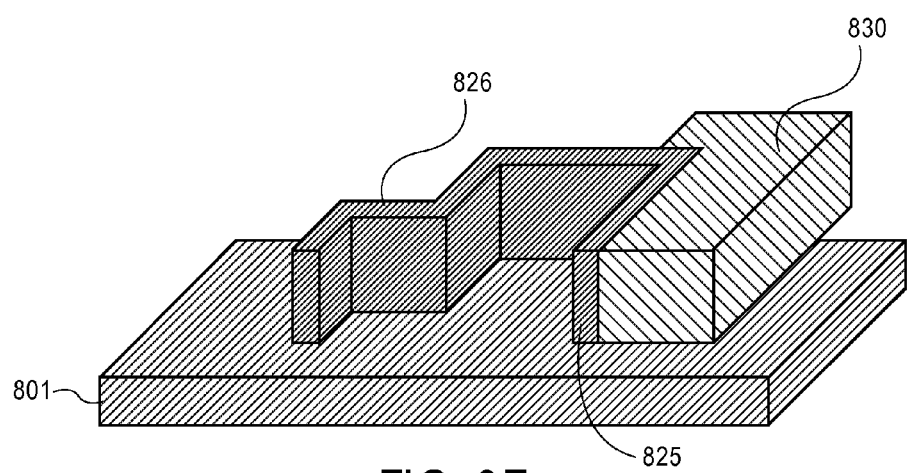

Finally, in FIG. 8F, barrier layer 805 is a sacrificial layer removed to release from substrate 801 the first material 830, second material 825 and artifact 826 as the resonator structure. Commonly known wet etch or dry etch techniques may be used to remove barrier layer 805. In a particular embodiment employing a germanium barrier layer 805, a wet etch comprising an aqueous solution of $H_2O_2$ with a concentration in the range of 25-35% by volume at a temperature in the range of 80° C.-95° C. is employed.

Figure 9A:
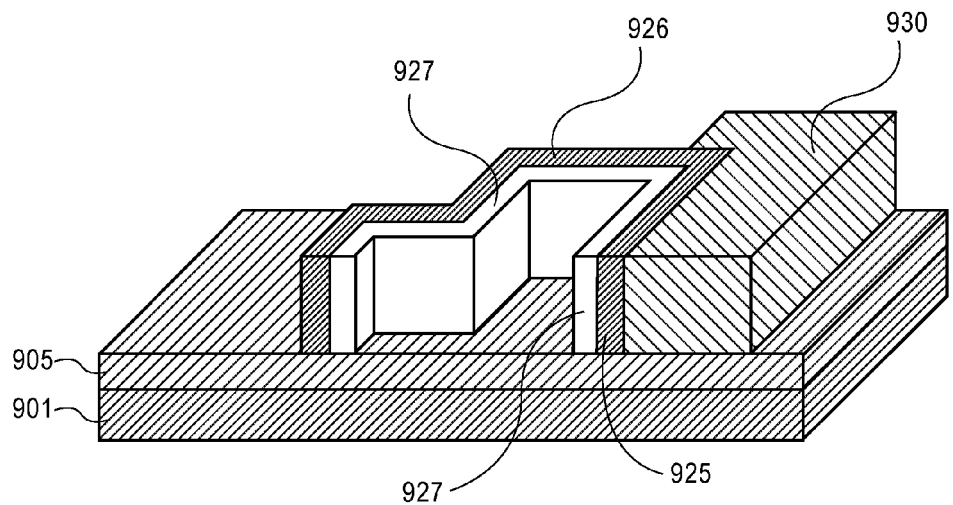
FIGS. 9A-9C are prospective views of a method of fabricating a cantilevered beam resonator in accordance with an embodiment of the present invention.
Figure 9B:
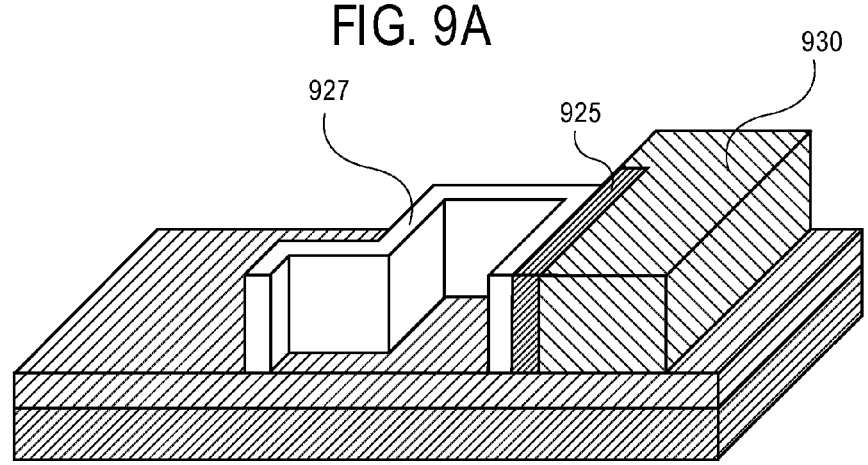
Figure 9C:
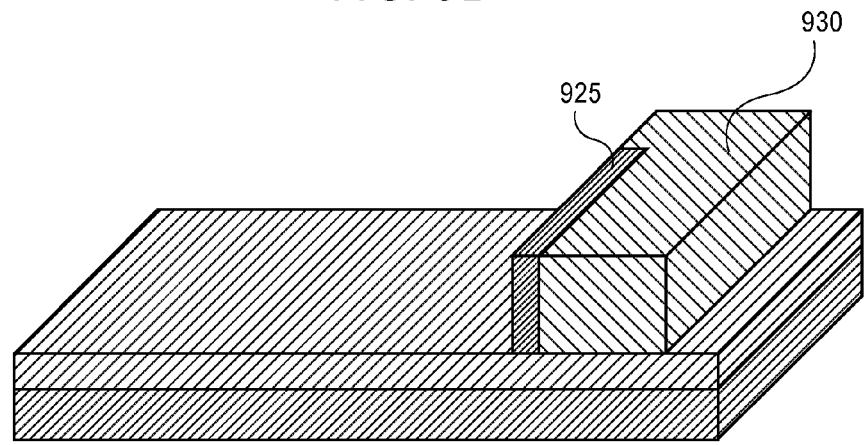

Although artifact 826 can be designed to have minimal impact on the resonator performance, it can be eliminated with a few additional commonly known operations. One such embodiment is shown in FIGS. 9A-9C. First, spacer 927 is formed in trench 815 of FIG. 8B after the formation of second material 825 of FIG. 8D to cover the sidewall of second material 925. Spacer 927 is of a material which provides selectivity to processes capable of etching second material 925. In a particular embodiment employing a silicon dioxide second material 925, spacer 927 is a silicon nitride material is deposited by CVD and is anisotropically etched selectively to second material 925, as is commonly known in the art. Following definition of first material 930 in the same manner described in reference to FIG. 8F, the structure depicted in FIG. 9A remains. As shown, artifact 926 is protected only on one sidewall by spacer 927 while second material 925 is protected on one sidewall by first material 930 and on another sidewall by spacer 927, enabling artifact 926 to be removed selectively to second material 925.

As shown in FIG. 9B, artifact 926 is etched isotropically through the as-deposited thickness using commonly known techniques. In one embodiment employing a silicon dioxide second material 925, a buffered oxide etch (BOE) or other hydrofluoric (HF) based wet chemistry is employed to remove artifact 926 without significantly recessing second material 925. Following removal of artifact 926, spacer 927 is selectively removed using commonly known techniques to leave only second material 925 and first material 930, as shown in FIG. 9C. In a particular embodiment, spacer 927 is isotropically etched in a wet etchant containing phosphoric acid ($H_3PO_4$).

Although the present invention has been described in language specific to structural features and/or methodological acts, it is to be understood that the invention defined in the appended claims is not necessarily limited to the specific features or acts described. For example, many applications may benefit from embodiments in accordance with the present invention and one of ordinary skill in the art would recognize the temperature compensated resonators described as particularly graceful implementations of the claimed invention useful for Illustrating the present invention.

We claim:

1. A method of forming a MEMS resonator comprising:
    forming a first structural material on a substrate;
    patterning the first structural material;

forming over the first structural material, a second structural material having a different Young's modulus temperature coefficient than the first structural material;

planarizing the second structural material to expose the first structural material;

patterning a resonator containing both the first and second structural materials; and anchoring the patterned resonator to an anchor, where the first structural material is confined to a region of the resonator having a longest dimension that is shorter than a distance between the anchor and a point of the resonator furthest from the anchor.

2. The method of claim 1, wherein forming the first structural material comprises depositing an silicon dioxide and wherein forming the second structural material comprises depositing a polycrystalline silicon germanium alloy.

3. The method of claim 1, wherein patterning the first structural material comprises patterning the first structural material to have a dimension required to compensate the temperature coefficient of frequency of the resonator.

4. The method of claim 1, wherein forming the first and second structural materials further comprises depositing films at a temperature below 500° C.

5. The method of claim 1, wherein forming the first structural material comprises depositing a polycrystalline silicon germanium alloy and wherein forming the second structural material comprises depositing silicon dioxide.

6. The method of claim 1, wherein forming the first structural material comprises depositing silicon dioxide and wherein forming the second structural material comprises depositing a polycrystalline silicon germanium alloy.

7. The method of claim 1, further comprising patterning the first structural material through lithography and etch to have a dimension required to compensate the temperature coefficient of frequency of the resonator.

8. The method of claim 1, wherein planarizing the second structural material to expose the first structural material further comprises removing the second structural material from the top surface of the first structural material with chemical-mechanical polishing.

9. The method of claim 1, where the first structural material has a positive Young's modulus temperature coefficient and where the second structural material has a negative Young's modulus temperature coefficient.

10. The method of claim 1, where the first structural material is a dielectric and the second structural material is a semiconductor.

11. The method of claim 1, where the top surface of the first structural material is planar with the top surface of the second structural material.

12. The method of claim 1, where the resonator is a beam; and where the region of the resonator to which the first structural material is confined includes a point of maximum flexural stress within the resonator when the resonator is made to resonate.

13. The method of claim 1, where the resonator is a beam; and where the region of the resonator to which the first structural material is confined includes a point of maximum stress within the resonator and excludes a point of maximum displacement when the resonator is made to resonate.

14. The method of claim 1, where the resonator is a bulk mode resonator; and where the region of the resonator to which the first structural material is confined is an isolated block completely surrounded by the second structural material.

15. The method of claim 1, where the first structural material stiffens the resonator region to which the first structural material is confined as a function of temperature to tune a temperature coefficient of frequency of the resonator in a manner at least partially decoupled from the resonator temperature coefficient.

16. The method of claim 1, where an edge of the first structural material farthest from the anchor is disposed a first distance from the anchor, the first distance being less than a distance between the anchor and a point of maximum displacement during resonance.

17. The method of claim 1,
where the first structural material is isolated to a region of the resonator proximate to a point of maximum stress within the resonator during operation.

18. The method of claim 1,
where the resonator is a bulk-mode resonator, and where the method further comprises patterning the first structural material in a radial array.

19. The method of claim 18, further comprising patterning the first structural material in a radial array about the anchor.

20. The method of claim 18, where the first structural material has a positive Young's modulus temperature coefficient and the second structural material has a negative Young's modulus temperature coefficient.

21. The method of claim 18, where the top surface of the first structural material is planar with the top surface of the second structural material.

* * * * *